United States Patent
Kishi (10) Patent No.: US 11,074,951 B2
(45) Date of Patent: Jul. 27, 2021

(54) MAGNETIC MEMORY DEVICE

(71) Applicant: TOSHIBA MEMORY CORPORATION, Tokyo (JP)

(72) Inventor: Tatsuya Kishi, Seongnam-si (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 47 days.

(21) Appl. No.: 16/568,102

(22) Filed: Sep. 11, 2019

(65) Prior Publication Data

US 2020/0302988 A1 Sep. 24, 2020

(30) Foreign Application Priority Data

Mar. 20, 2019 (JP) .............................. JP2019-052164

(51) Int. Cl.
| | |
|---|---|
| *H01L 27/22* | (2006.01) |
| *G11C 11/16* | (2006.01) |
| *H01L 43/10* | (2006.01) |
| *H01L 43/08* | (2006.01) |
| *H01F 10/32* | (2006.01) |

(52) U.S. Cl.
CPC .......... *G11C 11/161* (2013.01); *H01F 10/324* (2013.01); *H01L 27/222* (2013.01); *H01L 43/08* (2013.01); *H01L 43/10* (2013.01); *H01F 10/329* (2013.01)

(58) Field of Classification Search
CPC ................. H01F 10/329; H01F 10/3286–3295
See application file for complete search history.

(56) References Cited

U.S. PATENT DOCUMENTS

| | | | |
|---|---|---|---|
| 7,269,059 B2 | 9/2007 | Morise et al. | |
| 8,169,817 B2 | 5/2012 | Nakayama et al. | |
| 8,644,058 B2 | 2/2014 | Yamada et al. | |
| 2013/0302649 A1* | 11/2013 | Takahashi | H01F 10/329 428/811.3 |
| 2018/0083186 A1* | 3/2018 | Sasaki | H01L 27/222 |
| 2019/0147929 A1* | 5/2019 | Sasaki | H01L 43/02 365/158 |
| 2020/0083286 A1* | 3/2020 | Manipatruni | G11C 11/161 |

(Continued)

FOREIGN PATENT DOCUMENTS

| | | |
|---|---|---|
| JP | 2006086476 A | 3/2006 |
| JP | 2009239122 A | 10/2009 |

(Continued)

OTHER PUBLICATIONS

Alijani Zamani, Vajiheh, Structure and properties of quaternary and tetragonal Heusler compounds for spintronics and spin transfer torque applications Mar. 22, 2012 (Year: 2012).*

(Continued)

*Primary Examiner* — Jarrett J Stark
(74) *Attorney, Agent, or Firm* — Holtz, Holtz & Volek PC (57) ABSTRACT

According to one embodiment, a magnetic memory device includes a magnetoresistive element including a first magnetic layer having a variable magnetization direction, a second magnetic layer having a fixed magnetization direction, and a nonmagnetic layer provided between the first magnetic layer and the second magnetic layer. The first magnetic layer contains nickel (Ni), cobalt (Co), manganese (Mn) and gallium (Ga) and has a spin polarization less than 0.71.

3 Claims, 4 Drawing Sheets

(56) References Cited

U.S. PATENT DOCUMENTS

| | | | |
|---|---|---|---|
| 2020/0083427 A1* | 3/2020 | Manipatruni | H01F 10/324 |
| 2020/0266336 A1* | 8/2020 | Nakada | H01L 43/02 |
| 2020/0302988 A1* | 9/2020 | Kishi | H01L 43/08 |

FOREIGN PATENT DOCUMENTS

| | | |
|---|---|---|
| JP | 4915626 B2 | 4/2012 |
| WO | 2011033716 A1 | 3/2011 |

OTHER PUBLICATIONS

Bazaliy, et al., "Current-induced magnetization switching in small domains of different anisotropies", Physical Review B, vol. 69, No. 9, Mar. 22, 2004, pp. (094421-1)-(094421-19).

* cited by examiner

MAGNETIC MEMORY DEVICE

CROSS-REFERENCE TO RELATED APPLICATIONS

This application is based upon and claims the benefit of priority from Japanese Patent Application No. 2019-052164, filed Mar. 20, 2019, the entire contents of which are incorporated herein by reference.

FIELD

Embodiments described herein relate generally to a magnetic memory device.

BACKGROUND

Magnetic memory devices (semiconductor integrated circuit device) in which magnetoresistive elements and transistors are integrated on a semiconductor substrate, have been proposed.

However, it is not evaluated that the conventional magnetoresistive elements always perform stable memory operation.

DETAILED DESCRIPTION

In general, according to one embodiment, a magnetic memory device includes: a magnetoresistive element including: a first magnetic layer having a variable magnetization direction; a second magnetic layer having a fixed magnetization direction; and a nonmagnetic layer provided between the first magnetic layer and the second magnetic layer, the first magnetic layer containing nickel (Ni), cobalt (Co), manganese (Mn) and gallium (Ga) and having a spin polarization less than 0.71.

Hereafter, embodiments will be described with reference to drawings.

Embodiment 1

Figure 1A:
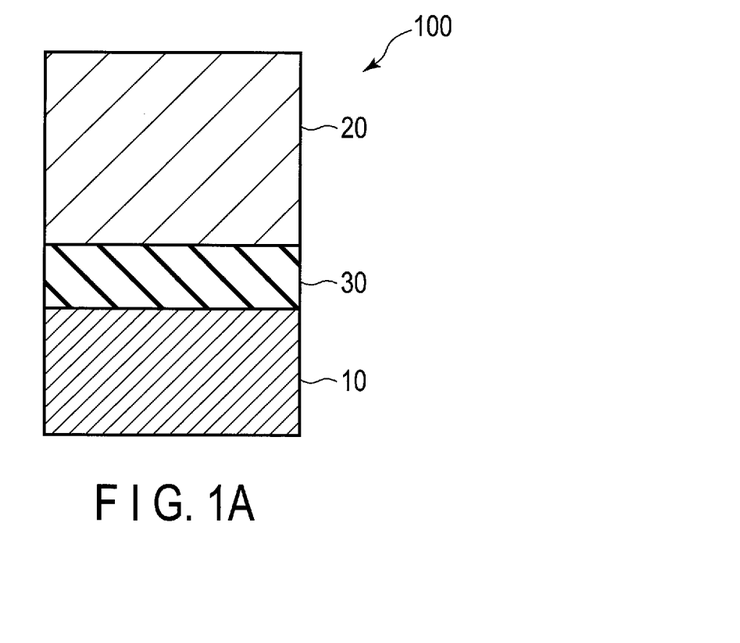
FIG. 1A is a cross section schematically showing an example of a basic structure of a magnetic memory device according to the first embodiment.

FIG. 1A is a cross section schematically showing the basic structure of a magnetic memory device according to the first embodiment, and is, more specifically a cross section schematically showing the basic structure of a magnetoresistive element included in the magnetic memory device. Note that a magnetoresistive element is also called a magnetic tunnel junction (MTJ) element.

A magnetoresistive element 100 is configured as a stacked structure comprising a storage layer (a first magnetic layer) 10, a reference layer (a second magnetic layer) 20, and a tunnel barrier layer (a nonmagnetic layer) 30 provided between the storage layer 10 and the reference layer 20. The storage layer 10 is a ferromagnetic layer having a variable magnetization direction, and the reference layer 20 is a ferromagnetic layer having a fixed magnetization direction. The variable magnetization direction means that the magnetization direction varies with respect to a predetermined write current. The fixed magnetization direction means that the magnetization direction does not vary with respect to a predetermined write current.

The magnetoresistive element 100 described above is formed on a lower region, which is not illustrated. In the lower region, a semiconductor substrate, a transistor, wiring lines, an interlayer insulating film, and the like are contained.

Figure 1B:
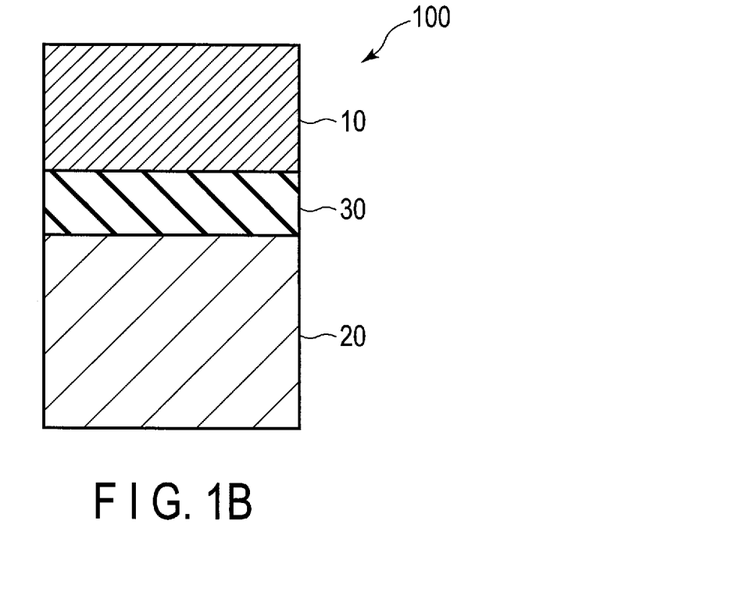
FIG. 1B is a cross section schematically showing another example of the basic structure of the magnetic memory device according to the first embodiment.

Note that the magnetoresistive element 100 shown in FIG. 1A is a bottom-free magnetoresistive element in which the storage layer 10, the tunnel barrier layer 30, and the reference layer 20 are stacked in this order from the lower layer side (the semiconductor substrate side), but it may be, as shown in FIG. 1B, a top-free magnetoresistive element in which the reference layer 20, the tunnel barrier layer 30, and the storage layer 10 are stacked in this order from the lower layer side (the semiconductor substrate side).

Moreover, the magnetoresistive element 100 may further contain, stacked therein, a shift canceling layer having a fixed magnetization direction antiparallel to the magnetization direction of the reference layer 20, and has a function which cancels a magnetic field applied to the storage layer 10 from the reference layer 20.

The magnetoresistive element 100 has a low-resistance state in which the magnetization direction of the storage layer 10 is parallel to the magnetization direction of the reference layer 20, and also a high-resistance state in which the magnetization direction of the storage layer 10 is antiparallel to the magnetization direction of the reference layer 20. Therefore, the magnetoresistive element 100 can store binary data (0 or 1) according to the resistance state (the low-resistance state or the high-resistance state). Moreover, the magnetoresistive element 100 can be set to the low-resistance state (a parallel state) or the high-resistance state (anti-parallel state) according to the direction of current allowed to flow to the magnetoresistive element 100.

The magnetoresistive element 100 described above is a spin transfer torque (STT) magnetoresistive element, and has a perpendicular magnetization. That is, the magnetization direction of the storage layer 10 is perpendicular to the main surface, and the magnetization direction of the reference layer 20 is perpendicular to the main surface. Here, the term "perpendicular" means that the direction θ of residual magnetization is in a range of 45°<θ≤90° to the surface of the film.

In this embodiment, the storage layer (first magnetic layer) 10 contains nickel (Ni), cobalt (Co), manganese (Mn), and gallium (Ga), and has a spin polarization of less than 0.71. With use of the storage layer 10 having such a structure, a magnetoresistive element which can perform stable memory operation (stable write operation) can be obtained. Detailed descriptions will be provided.

Generally, the movement of spin is expressed by Landau-Lifshitz-Gilbert (LLG) formulas which will be set out below.

$$\dot{\vec{m}} = -\gamma \frac{\partial E}{\partial \vec{m}} \times \vec{m} + \tilde{\alpha}\vec{m} \times \dot{\vec{m}} - \gamma \frac{\hbar}{2e} \frac{I}{M_S V} g(\theta, P\_SL)\vec{m} \times (\vec{s} \times \vec{m})$$

Here, $$\dot{\vec{m}}$$

is the time differential of the spin.

$$-\gamma \frac{\partial E}{\partial \vec{m}} \times \vec{m}$$

of the first term on the right-hand side is a precession term.

$$\tilde{\alpha}\vec{m} \times \dot{\vec{m}}$$

of the second term of the right-hand side is a damping term.

$$\gamma \frac{\hbar}{2e} \frac{1}{M_S V} g(\theta, P\_SL)\vec{m} \times (\vec{s} \times \vec{m})$$

of the third term of the right-hand side is a spin-torque term.

Moreover, E contained in the first term of the right-hand side expresses the energy of the system, which is given by:

$$E = -K_u^{eff} \cos^2\theta - M_s \vec{H}_{ext} \cdot \vec{m}$$

Here, $$K_u^{eff}$$

expresses the magnetic anisotropy energy. $\theta$ is an angle to the spin of reference layer. $M_s$ is magnetization.

$$\vec{H}_{ext}$$

is an external magnetic field.

Moreover, the function g which appears in the third term of the right-hand side expresses a spin injection efficiency. In the case of the magnetoresistive element, it is given by:

$$g(\theta, P\_SL) = \frac{1}{2} \times \frac{P\_SL}{1 + (P\_SL)^2 \cos(\theta)}$$

Here, the LLG formula is expressed as follows.

$$\dot{\vec{m}} - \tilde{\alpha}\vec{m} \times \dot{\vec{m}} = \vec{F}(\vec{m})$$

$$\vec{F}(\vec{m}) \equiv -\gamma \frac{\partial E}{\partial \vec{m}} \times \vec{m} - \gamma \frac{\hbar}{2e} \frac{I}{M_S V} g(\theta, P\_SL)\vec{m} \times (\vec{s} \times \vec{m})$$

Furthermore, if the LLG formula is expressed by polar coordinates, the following formula is obtained.

$$\begin{pmatrix} \sin\theta & -\alpha \\ -\alpha\sin\theta & -1 \end{pmatrix} \begin{pmatrix} \dot{\theta} \\ \dot{\varphi} \end{pmatrix} = \begin{pmatrix} v_\theta \\ v_\varphi \end{pmatrix}$$

$$v_\theta \equiv \vec{F}(\vec{m}) \cdot \vec{e}\theta, \quad v_\varphi \equiv \vec{F}(\vec{m}) \cdot \vec{e}\varphi$$

When the above formula is transformed, the following can be obtained.

$$\begin{pmatrix} \dot{\theta} \\ \dot{\varphi} \end{pmatrix} = \frac{1}{1+\alpha^2} \begin{pmatrix} \frac{1}{\sin\theta} & \frac{-\alpha}{\sin\theta} \\ -\alpha & -1 \end{pmatrix} \begin{pmatrix} v_\theta \\ v_\varphi \end{pmatrix} \quad (1)$$

All the equilibrium state can be obtained by solving the following formula:

$$v_\theta = 0, v_\varphi = 0$$

When the formula is linearized around "$\theta=0$", the following formula is obtained.

$$\begin{pmatrix} \dot{\theta} \\ \dot{\varphi} \end{pmatrix} = \frac{1}{1+\alpha^2} \begin{pmatrix} \frac{1}{\sin\theta} & \frac{-\alpha}{\sin\theta} \\ -\alpha & -1 \end{pmatrix} \begin{pmatrix} v_\theta \\ v_\varphi \end{pmatrix}$$

$$= \frac{1}{1+\alpha^2} \begin{pmatrix} \frac{1}{\sin\theta} & \frac{-\alpha}{\sin\theta} \\ -\alpha & -1 \end{pmatrix} \begin{pmatrix} \frac{\partial v_\theta}{\partial \theta} & \frac{\partial v_\theta}{\partial \varphi} \\ \frac{\partial v_\varphi}{\partial \theta} & \frac{\partial v_\varphi}{\partial \varphi} \end{pmatrix} \begin{pmatrix} \delta\theta \\ \delta\varphi \end{pmatrix} + O(\delta\theta^2, \delta\varphi^2)$$

$$\cong \hat{D} \begin{pmatrix} \delta\theta \\ \delta\varphi \end{pmatrix}$$

Here, D is a dynamic matrix.

The stability of spin is determined by the conditions that the sign of the real part of the eigenvalue of the dynamic matrix becomes negative. When one of the two eigenvalues is set to k, the stabilization condition is given by:

$$\text{Re}[k] < 0$$

For simplification, the following symbols are introduced.

$$\omega_H \equiv \gamma H_{ext}, \quad \omega_K \equiv \gamma \frac{K_u^{eff}}{M_S}, \quad \omega_j \equiv \gamma \frac{\hbar}{2} A \frac{j}{e} \frac{1}{M_S V}, \quad \alpha \equiv \frac{\alpha}{M_S}$$

When the above-described symbols are used, $$g_n = g(\theta = 0, P\_SL)$$

is used to obtain $$(1+\alpha^2)\hat{D} = \begin{pmatrix} -[\omega_j g_n + \alpha(\omega_H + \omega_K)] & \omega_H + \omega_K - \alpha\omega_j g_n \\ -(\omega_H + \omega_K - \alpha\omega_j g_n) & -[\omega_j g_n + \alpha(\omega_H + \omega_K)] \end{pmatrix}$$

Therefore, the eigenvalues of the dynamic matrix is as follows.

$$k = \omega_j g_n - \alpha(\omega_H + \omega_K) \pm i|\omega_H + \omega_K - \alpha\omega_j g_n|$$

From the above-described stabilization conditions, the following relationship is obtained.

$$\omega_{jP} > -\frac{\alpha(\omega_H + \omega_K)}{g_n} \quad (2)$$

The above relationship expresses the stable region of a parallel state (P state).

Similarly, in order to determine the stable region of an anti-parallel state (AP state), formula (1) is linearized around "$\theta=\pi$". Then, the eigenvalues of the dynamic matrix are obtained as in a manner similar to the above, and the stabilization condition thereto is expressed by $$\omega_{jAP} < -\frac{\alpha(\omega_H - \omega_K)}{g_S} \quad (3)$$

$$g_S \equiv g(\theta = \pi, P\_SL)$$

Next, "cycle" states other than "θ=0, π" will be examined. This state is not a state in which the parallel state (P state) or anti-parallel state (AP state) is stable, but a state in which a stable precession is carried out. That is, it is an unstable state as a memory device, in which a write error can occur. This state can be defined by:

$$\dot{\theta}=0$$

From this definition, the following formula is obtained.

$$\omega_j g_0 + \alpha(\omega_H + \omega_K) = 0$$

$$\omega \equiv \dot{\varphi} = \omega_H + \omega_K \cos\theta_0$$

$$g_0 \equiv g(\theta_0, P\_SL)$$

When the above formula is solved about ω, $$\frac{\omega_j}{\alpha} g\left(\frac{\omega - \omega_H}{\omega_K}, P\_SL\right) + \omega = 0 \quad (4)$$

$$\frac{\omega_j \omega_K}{\alpha P\_SL} = -\omega\left(\omega - \omega_H + \frac{\omega_K}{(P\_SL)^2}\right)$$

can be obtained.
Here, $$-1 \le \cos\theta_0 \ge +1$$

and therefore, the above formula has a solution to ω only in the following range.

$$\omega_- \le \omega \le \omega_+$$

$$\omega_- \equiv \omega_H - |\omega_K|, \omega_+ \equiv \omega_H + |\omega_K|$$

Figure 2:
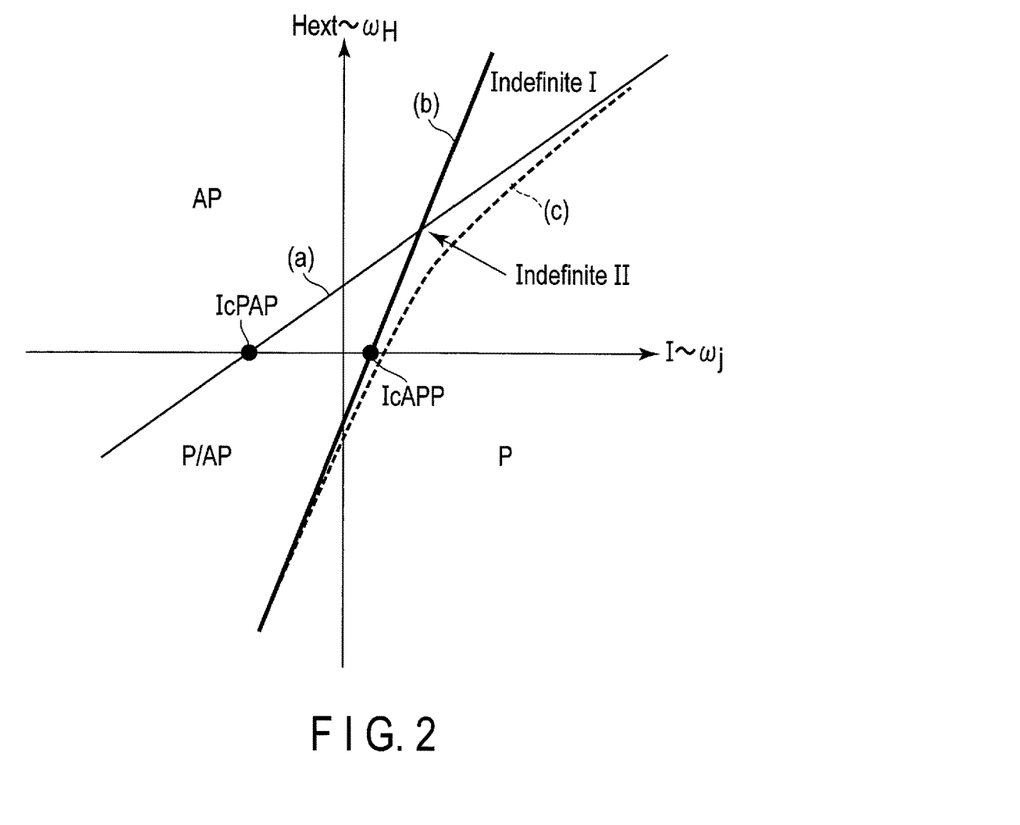
FIG. 2 is a phase diagram expressing a memory operation in a current-magnetic field plane.

As described above, formula (2), formula (3) and formula (4) express memory operations in a current-magnetic field plane ($\omega_j$–$\omega_H$ plane), which create a phase diagram as shown in FIG. 2. In FIG. 2, a horizontal axis ($\omega_j$ axis) expresses a current I, and a vertical axis ($\omega_H$ axis) expresses a magnetic field Hext.

In FIG. 2, the region P indicates a region in which the state where the magnetization direction of the storage layer is parallel to the magnetization direction of the reference layer is stable, and the region AP indicates a region in which the state where the magnetization direction of the storage layer is antiparallel to the magnetization direction of the reference layer is stable. Moreover, a line (a) is a parallel-to-antiparallel (PAP) reversal boundary line, a line (b) is an antiparallel-to-parallel (APP) reversal boundary line, and a line (c) is an unstable region boundary line.

As shown in FIG. 2, one indefinite region (Indefinite I) is located far distant from the current axis, but another indefinite region (Indefinite II) is located to cross the current axis. This indefinite region (Indefinite II) is an unstable region which poses a problem to stable memory operation. Hereafter, the unstable region will be described.

Figure 3:
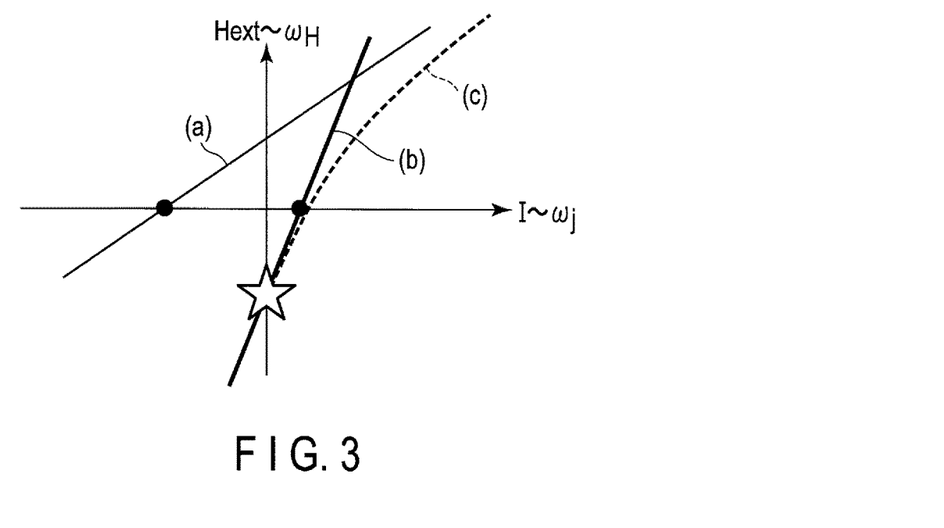
FIG. 3 is a phase diagram expressing a memory operation in a current-magnetic field plane.

As shown in FIG. 3, generally, the unstable region crosses $\omega_j$-axis and intersects the APP reversal boundary line (b) in a third quadrant or fourth quadrant. Here, a region interposed between the APP reversal boundary line and the unstable region boundary line on the $\omega_j$ axis becomes an unstable state. The memory operation is generally carried out when an external magnetic field is zero. That is, it suffices if only on a current-axis (x-axis) is considered. In this case, a positive current is allowed to flow in order to cause the APP reversal. Here, the current to flow is increased to exceed the APP reversal boundary line. At the moment when the flowing current excesses the APP reversal boundary, it enters an unstable region, thus making the write operation unstable. As a result, an error occurs in the memory operation, thus enhancing the write error.

Figure 4:
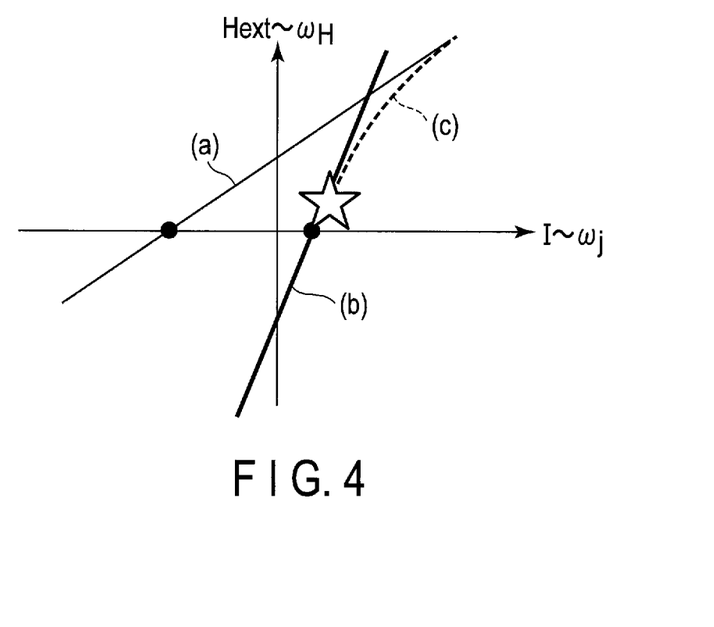
FIG. 4 is a phase diagram expressing a memory operation in a current-magnetic field plane.

On the other hand, as shown in FIG. 4, if the unstable region is confined in the first quadrant, the unstable region does not intersect the $\omega_j$ axis. That is, even if the current is increased in order to perform the APP reversal operation, it does not enter the unstable region. Therefore, the unstable region being confined the first quadrant is a conditions which stabilizes the memory operation.

Next, the condition which stabilizes the memory operation will be clarified.

First, the right-hand side of formula (4) is focused. The right-hand side of formula (4) is a quadratic of ω, and its peak is obtained by $$\left(\omega_c, \frac{\omega_{jc}\omega_K}{\alpha(P\_SL)^2}\right) = \left(\frac{\omega_H - \frac{\omega_K}{(P\_SL)^2}}{2}, \frac{\omega_H - \frac{\omega_K}{(P\_SL)^2}}{4}\right)$$

Detailed analysis indicates that the unstable region is specified under the following condition.

$$\omega_- \le \omega_C \le \omega_+$$

When this condition is rearranged, $$\omega_{H_1} \le \omega_H \le \omega_{H_2}$$

$$\omega_{H_1} \equiv -2|\omega_K| - \frac{\omega_K}{(P\_SL)^2}, \omega_{H_2} \equiv 2|\omega_K| - \frac{\omega_K}{(P\_SL)^2}$$

is obtained.

The unstable region is specified as described above. The condition to confine the unstable region in the first quadrant is as follows.

$$\omega_{H_2} < 0$$

In consideration of the fact that $\omega_K > 0$, the following formula can be drawn from the above-provided condition, $$P < (\tfrac{1}{2})^{1/2} \cong 0.71.$$

From the above, it is understood that the storage layer 10 should preferably have a spin polarization P_SL of less than 0.71.

Next, the lower limit of the spin polarization P_SL of the storage layer 10 will be considered.

As described above, in order to obtain stable memory operation (stable write operation), the spin polarization of the storage layer 10 should preferably be less than 0.71. However, if the spin polarization is excessively low, the MR ratio is accordingly reduced, which is not preferable for read operation.

Figure 5:
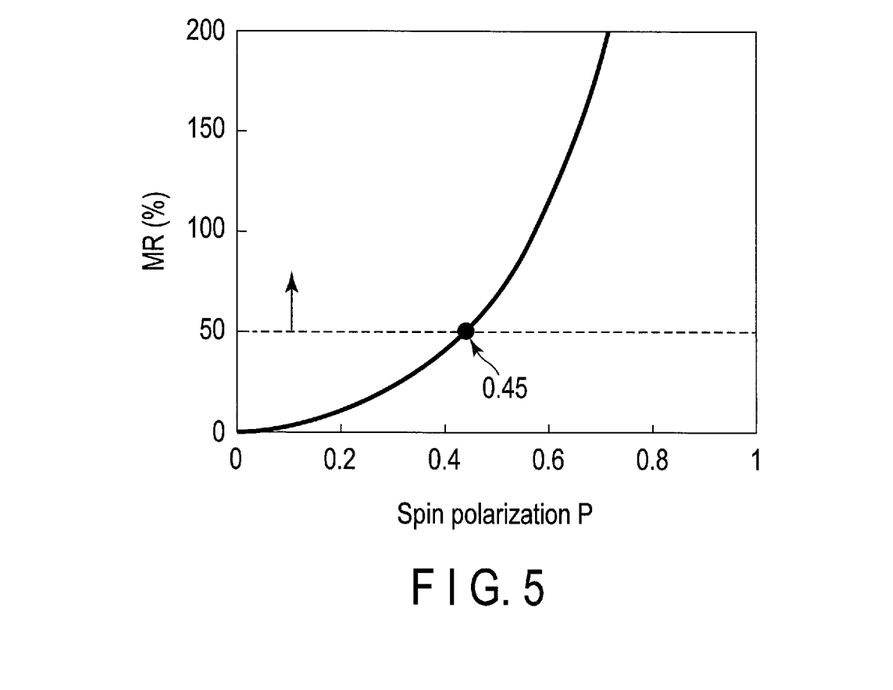
FIG. 5 is a diagram showing a general relationship between a spin polarization of a storage layer and an MR ratio.

FIG. 5 is a diagram showing a general relationship between the spin polarization P_SL of the storage layer and the MR ratio. Usually, in order to perform proper read operation, it is preferable that the MR ratio be higher than about 50%. Based on this, it can be concluded from FIG. 5 that the storage layer 10 should preferably have a spin polarization P_SL higher than 0.45.

As already mentioned, the storage layer 10 of this embodiment is formed of a ferromagnetic material layer containing nickel (Ni), cobalt (Co), manganese (Mn) and gallium (Ga) (hereafter, this layer may be referred to simplify an NiCoMnGa layer). Hereafter, a preferable composition range of the storage layer (NiCoMnGa layer) 10 of this embodiment will be discussed.

Figure 6:
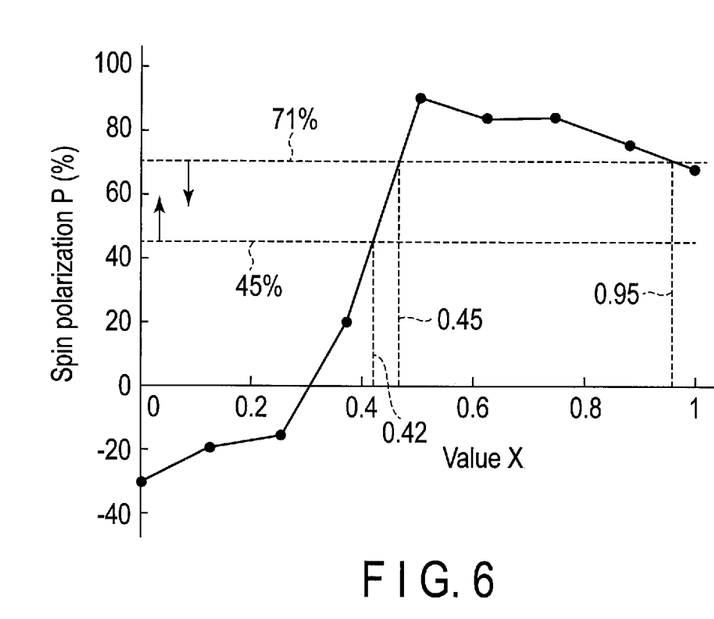
FIG. 6 is a diagram showing a relationship of a composition and the spin polarization of the storage layer.

FIG. 6 is a diagram showing a relationship between composition of the storage layer (NiCoMnGa layer) and the spin polarization P_SL. In FIG. 6, the composition of the NiCoMnGa layer is expressed by $(Ni_{1-x}Co_x)_2MnGa$ and the horizontal axis indicates a value of x. That is, the ratio of a nickel (Ni) composition ratio to a cobalt (Co) composition ratio is set to (1−x)/x, and the horizontal axis indicates a value of x.

As described above, it is preferable that the spin polarization P_SL of the storage layer 10 be less than 0.71. Therefore, it can be seen from FIG. 6 that the value of x should preferably be less than 0.45 or higher than 0.95. Further, as described above, the spin polarization P_SL of the storage layer 10 should preferably be higher than 0.45. Based on this, it can be seen from FIG. 6 that the value of x should preferably be higher than 0.42 and less than 0.45, or higher than 0.95 and less than 1.00.

As described above, in this embodiment, the storage layer 10 contains nickel (Ni), cobalt (Co), manganese (Mn) and gallium (Ga), and has a spin polarization lower than 0.71. With this structure, a magnetoresistive element which can perform stable memory operation and stable write operation, can be obtained. Moreover, when the storage layer 10 is formed to have a spin polarization higher than 0.45, the decrease in MR ratio can be suppressed, thereby making it possible to perform stable read operation.

Note that in the magnetic memory device 100 of this embodiment, for example, the following materials can be used for the reference layer (second magnetic layer) 20 and the tunnel barrier layer (nonmagnetic layer) 30. For the reference layer 20, a ferromagnetic material similar to that of the storage layer 10 described above may be used. Or, a ferromagnetic material containing cobalt (Co), iron (Fe), and boron (B) may be used for the reference layer 20. For the tunnel barrier layer 30, an insulating material containing magnesium (Mg) and oxygen (O) can be used.

Embodiment 2

Next, the second embodiment will be described. Note that the basic items are similar to those of the first embodiment. Therefore, explanations for the items already discussed in the first embodiment will be omitted.

In this embodiment as well, the basic structure of the magnetoresistive element is similar to that of the magnetoresistive element 100 shown in FIGS. 1A and 1B of the first embodiment except that, in this embodiment, the storage layer (first magnetic layer) 10 is formed of a Heusler alloy, and has a spin polarization of less than 0.71.

More specifically, the storage layer 10 is formed of a Heusler alloy containing at least one of cobalt (Co) and iron (Fe), and at least one element selected from manganese (Mn), silicon (Si), germanium (Ge), aluminum (Al), gallium (Ga), tin (Sn), titanium (Ti), and vanadium (V).

Usable examples of the Heusler alloy to be used as the storage layer 10 will be provided bellow together with the following spin polarizations P_SL.

$Co_2Fe(Si_{0.75}Ge_{0.25})$ (P_SL=0.7)
$Co_2Fe(Ga_{0.5}Ge_{0.5})$ (P_SL=0.69)
$Co_2(Cr_{0.02}Fe_{0.98})Ga$ (P_SL=0.67)
$Co_2Mn(Ge_{0.25}Sn_{0.75})$ (P_SL=0.67)
$Co_2(Mn_{0.95}Fe_{0.05})Sr$ (P_SL=0.65)
$(Co_{1.93}Fe_{0.062})MnGe$ (P_SL=0.68)
$Co_2(Mn_{0.5}Fe_{0.5})Ga$ (P_SL=0.7)
$Co_2(Cr_{0.02}Fe_{0.98})Si$ (P_SL=0.65)
$Co_2Mn(Ti_{0.25}Sn_{0.75})$ (P_SL=0.64)
$Co_2Mn(Al_{0.5}Sn_{0.5})$ (P_SL=0.63)
$Co_2Mn(Ga_{0.25}Si_{0.75})$ (P_SL=0.63)
$Co_2Mn(Si_{0.25}Ge_{0.75})$ (P_SL=0.63)
$Co_2(Mn_{0.5}Fe_{0.5})Si$ (P_SL=0.61)
$Co_2Mn(Al_{0.5}Si_{0.5})$ (P_SL=0.6)
$Co_2Fe(Ga_{0.5}Si_{0.5})$ (P_SL=0.6)
$Co_2Fe(Al_{0.5}Si_{0.5})$ (P_SL=0.6)
$Co_2CrAl$ (P_SL=0.62)
$Co_2CrGa$ (P_SL=0.61)
$Co_2MnSn$ (P_SL=0.6)
$Co_2MnAl$ (P_SL=0.6)
$Co_2MnGa$ (P_SL=0.6)
$Co_2FeSi$ (P_SL=0.6)
$Co_2FeAl$ (P_SL=0.59)
$Co_2MnGe$ (P_SL=0.58)
$Co_2FeGe$ (P_SL=0.58)
$Co_2FeGa$ (P_SL=0.58)
$Co_2TiSn$ (P_SL=0.57)
$Co_2MnSi$ (P_SL=0.56)
$Fe_2VAl$ (P_SL=0.56)
$Co_2VAl$ (P_SL=0.48).

In this embodiment, the storage layer 10 is formed of a Heusler alloy and has a spin polarization less than 0.71. Thus, for a reason similar to that explained in the first embodiment, a magnetoresistive element which can perform stable memory operation and stable write operation, can be obtained. Moreover, in this embodiment as well, for a reason similar to that explained in the first embodiment, by forming the storage layer 10 to have a spin polarization higher than 0.45, the decrease in MR ratio can be suppressed, and the read operation can be stably carried out.

While certain embodiments have been described, these embodiments have been presented by way of example only, and are not intended to limit the scope of the inventions/present disclosures. Indeed, the novel embodiments described herein may be embodied in a variety of other forms; furthermore, various omissions, substitutions and changes in the form of the embodiments described herein may be made without departing from the spirit of the inventions/present disclosures. The accompanying claims and their equivalents are intended to cover such forms or modifications as would fall within the scope and spirit of the inventions/present disclosures.

What is claimed is:
1. A magnetic memory device comprising:
a magnetoresistive element comprising:
    a first magnetic layer having a variable magnetization direction;
    a second magnetic layer having a fixed magnetization direction; and
    a nonmagnetic layer provided between the first magnetic layer and the second magnetic layer,
    wherein the first magnetic layer contains nickel (Ni), cobalt (Co), manganese (Mn), and gallium (Ga), and
    wherein when a ratio of a nickel (Ni) composition ratio to a cobalt (Co) composition ratio in the first magnetic layer is set to (1−x)/x, a value of x is higher than 0.42 and less than 0.45 or higher than 0.95 and less than 1.00.

2. The device of claim 1, wherein the magnetoresistive element is a spin transfer torque (STT) magnetoresistive element.

3. The device of claim 1, wherein the magnetoresistive element has perpendicular magnetization.

\* \* \* \* \*